(12) United States Patent
Foster et al.

(10) Patent No.: US 8,637,759 B2
(45) Date of Patent: Jan. 28, 2014

(54) NOTCH FILTER FOR TRIPLE JUNCTION SOLAR CELLS

(75) Inventors: Thomas E. Foster, Covington, WA (US); James Snyder, Mountain View, CA (US)

(73) Assignee: The Boeing Company, Chicago, IL (US)

( * ) Notice: Subject to any disclaimer, the term of this patent is extended or adjusted under 35 U.S.C. 154(b) by 1345 days.

(21) Appl. No.: 11/305,434

(22) Filed: Dec. 16, 2005

(65) Prior Publication Data

US 2007/0137694 A1 Jun. 21, 2007

(51) Int. Cl.
*H01L 25/00* (2006.01)

(52) U.S. Cl.
USPC ........... 136/243; 136/261; 136/262; 136/257; 438/57; 438/72; 438/77; 438/93; 250/226

(58) Field of Classification Search
USPC ........ 136/243, 261, 262, 257; 438/57, 72, 77, 438/93; 250/226
See application file for complete search history.

(56) References Cited

U.S. PATENT DOCUMENTS

| | | | |
|---|---|---|---|
| 3,076,861 A * | 2/1963 | Samulon et al. | 136/257 |
| 3,423,147 A | 1/1969 | Thelen | |
| 5,098,482 A * | 3/1992 | Warfield | 136/259 |
| 5,248,346 A | 9/1993 | Fraas et al. | |
| 5,449,413 A * | 9/1995 | Beauchamp et al. | 136/257 |
| 6,107,564 A | 8/2000 | Aguilera et al. | |
| 7,319,189 B2 * | 1/2008 | Ruelle et al. | 136/246 |
| 2005/0103374 A1 | 5/2005 | Moy | |

FOREIGN PATENT DOCUMENTS

GB 2396436 6/2004

OTHER PUBLICATIONS

T. Sumita et al, "Proton radiation analysis of multi-junction space solar cels", Nuclear Instuments and Methods in Physics Research B 206 (2003) 448-451.*
Daniel J. Aiken, "InGaP/GaAs/Ge Multi-junction solar cell efficiency improvement using epitaxial Germanium", 28th IEEE PVSC. 2000, p. 994-997.*
Frass, et al., "34% Efficient InGaP/GaAs/GaSb Cell-Interconnected-Circuits for Line-Focus Concentrator Arrays" Munich Conference, 2001.
International Preliminary Report on Patentability, International application No. PCT/US2006/047462, International filing date Dec. 13, 2006, report issued Jun. 18, 2008.

* cited by examiner

*Primary Examiner* — Xiuyu Tai
(74) *Attorney, Agent, or Firm* — Gates & Cooper LLP (57) ABSTRACT

A solar cell and method for producing same is disclosed. The solar cell includes a multijunction solar cell structure and a notch filter designed to reflect solar energy that does not contribute to the current output of the multijunction solar cell. By reflecting unused solar energy, the notch filter allows the solar cell to run cooler (and thus more efficiently) yet it still allows all junctions to fully realize their electrical current production capability.

19 Claims, 9 Drawing Sheets

| Incidence angle (°) | Theoretical currents (mA/cm$^2$) | | | | | | | Cell total | |
|---|---|---|---|---|---|---|---|---|---|
| | MgF$_2$ (AR coat) | | | Notch | | | | | |
| | GaInP | GaAs | Ge | GaInP | GaAs | Ge | | MgF$_2$ | Notch |
| 0 | 17.04 | 17.64 | 28.65 | 17.05 | 17.73 | 17.86 | | 17.04 | 17.05 |
| 15 | 17.04 | 17.63 | 28.64 | 17.05 | 17.72 | 17.74 | | 17.04 | 17.05 |
| 30 | 17.03 | 17.59 | 28.58 | 17.04 | 17.65 | 17.43 | | 17.03 | 17.04 |
| 45 | 16.92 | 17.43 | 28.30 | 16.89 | 17.45 | 17.01 | | 16.92 | 16.89 |
| 55 | 16.66 | 17.10 | 27.74 | 16.55 | 17.06 | 16.65 | | 16.66 | 16.55 |
| 60 | 16.38 | 16.78 | 27.17 | 16.21 | 16.69 | 16.41 | | 16.38 | 16.21 |
| 65 | 15.90 | 16.24 | 26.26 | 15.66 | 16.09 | 16.06 | | 15.90 | 15.66 |
| 70 | 15.09 | 15.36 | 24.79 | 14.78 | 15.13 | 15.51 | | 15.09 | 14.78 |
| 75 | 13.72 | 13.90 | 22.37 | 13.33 | 13.58 | 14.52 | | 13.72 | 13.33 |

*FIG. 10*

| Incidence angle (°) | Solar alpha | | Equilibrium Temperature (°C) | |
|---|---|---|---|---|
| | MgF$_2$ | Notch | MgF$_2$ | Notch |
| 0 | 0.96 | 0.85 | 138.7 | 127.1 |
| 15 | 0.95 | 0.85 | 135.2 | 123.6 |
| 30 | 0.95 | 0.85 | 124.0 | 112.4 |
| 45 | 0.95 | 0.84 | 103.6 | 92.1 |
| 55 | 0.93 | 0.82 | 82.9 | 71.6 |
| 60 | 0.91 | 0.80 | 69.4 | 58.4 |
| 65 | 0.89 | 0.78 | 52.9 | 42.3 |
| 70 | 0.84 | 0.74 | 32.2 | 22.3 |
| 75 | 0.77 | 0.68 | 5.2 | -3.5 |

FIG. 11

NOTCH FILTER FOR TRIPLE JUNCTION SOLAR CELLS

STATEMENT OF RIGHTS OWNED

This invention was made with Government support under contract. The Government has certain rights in this invention.

BACKGROUND OF THE INVENTION

1. Field of the Invention

The present invention relates to systems and methods for generating electricity from solar radiation, and in particular, to a method and apparatus for notch filtering for triple junction solar cells.

2. Description of the Related Art

Solar panels are typically used to generate power in spacecraft. These solar panels comprise a plurality of solar cells typically arranged in a planar matrix of multiple layers. Solar cell current is produced by photons causing electrons to jump energy states within solar cell junctions.

Increasing a solar cell's absorption of incident solar energy increases the solar energy available for the solar cell to convert into electricity. However, it can also increase the temperature of the solar cell, and solar cells operate with reduced efficiency ($\eta$) at elevated temperatures.

Early technology solar cells (including those using double junction or silicon technology) respond to relatively limited wavelength bands of solar energy, and often used reflection filters to reflect some of the solar energy at unneeded wavelengths to reduce their temperatures.

Newer technology solar cells include three or more junctions. Such solar cells are discussed in U.S. Pat. No. 6,380, 601, issued to Ermer et al and "1-eV GaInAs Solar Cells for Ultrahigh-Efficiency Multijunction Devices" by D. J. Friedman, J. F. Geisz, S. R. Kurtz, and J. M. Olson, published July 1998 and Presented at the $2^{nd}$ World Conference and Exhibition on Photovoltaic Solar Energy Conversion, 34% Efficient InGaP/GaAs/GaSb Cell-Interconnected Circuits for Line-Focus Concentrator Arrays," Munich Conference, 2001, by L. M. Fraas et al., all of which are hereby incorporated by reference.

Unfortunately, filters designed for two junction solar cells are inappropriate for use with triple junction cells because the solar cells respond to a wider wavelength band than are passed by those filters. What is needed is a filter design that maximizes the current output of solar cells with three or more junctions. The present invention satisfies that need.

SUMMARY OF THE INVENTION

To address the requirements described above, the present invention discloses a solar device and a method for making a solar device. In one embodiment, the solar device comprises a germanium substrate, a multijunction solar cell structure having at least first, second and third subcells disposed over the substrate; and a notch filter disposed over the multijunction solar cell structure. The notch filter comprises a repeating pattern of layers of materials formed of materials H, M and L, the repeating pattern comprising $(LMHHML)^x$, materials H and L having respective properties of high and low indices of refraction, material M having properties between those of materials H and L. The method comprises the steps of depositing a multijunction solar cell structure having at least first, second and third subcells on a substrate; and depositing a notch filter, comprising a repeating pattern of layers of materials formed of materials H, M and L on the multijunction solar cell structure, the repeating pattern comprising $(LMH-HML)^x$, materials H and L having respective properties of high and low indices of refraction, material M having properties between those of materials H and L. In another embodiment, the method comprises the steps of depositing a multijunction solar cell structure having at least first, second and third subcells on a substrate, and depositing a notch filter, comprising a repeating pattern of layers of materials formed of materials H, M and L a first side of a coverglass, adhering the coverglass to the multijunction solar cell structure, the repeating pattern comprising $(LMHHML)^x$, materials H and L having respective properties of high and low indices of refraction, material M having properties between those of materials H and L.

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Figure 1:
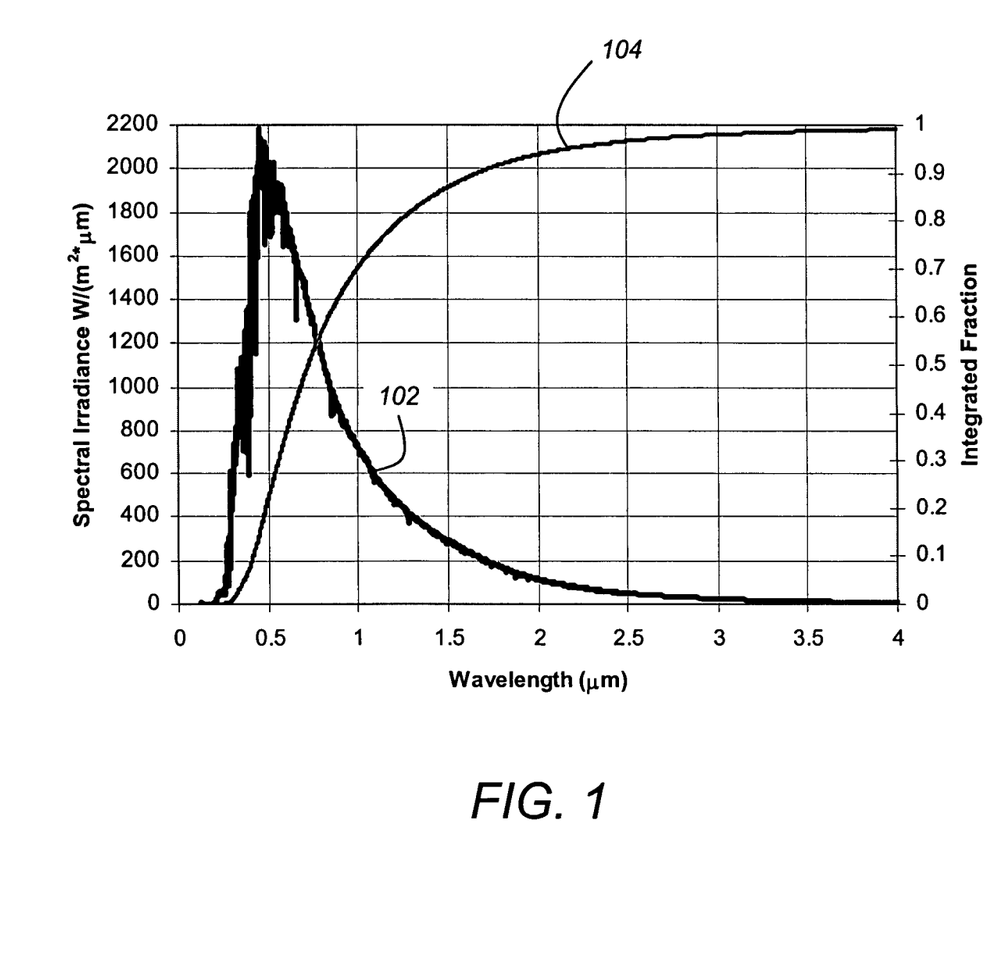
FIG. 1 is a plot illustrating the spectral characteristics of solar radiation.

FIG. 1 is a plot illustrating the spectral characteristics of solar radiation. Plot 102 plots the spectral irradiance as a function of wavelength of the solar spectrum. Plot 104 shows the integrated fraction of plot 102.

Figure 2:
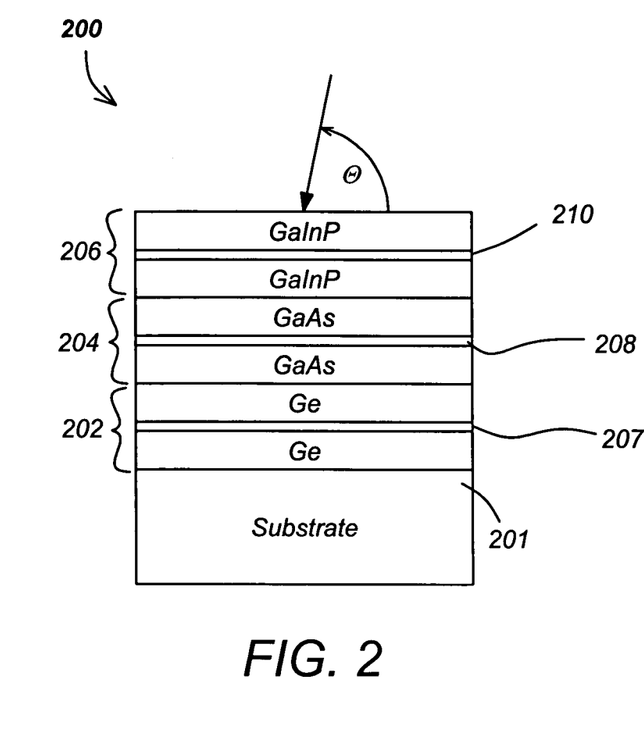
FIG. 2 is a diagram of a three-junction solar cell.

FIG. 2 is a diagram of a three-junction solar cell 200. The three junction solar cell 200 comprises a first layer 202, a second layer 204 and a third layer 206 disposed on a substrate 201, with each layer representing a subcell of the cell 200. In the illustrated embodiment, the first layer 202 comprises germanium (Ge), the second layer 204 comprises gallium arsenide (GaAs), and the third layer 206 comprises gallium-indium-phosphide (GaInP). Each of the layers has a respective junction 207, 208, and 210 which produces electrical current from incident photons within a particular frequency (or wavelength) band. This current is produced by photons causing electrons to jump energy states, or to have electron-hole pairs generated within the cell junctions.

Figure 3:
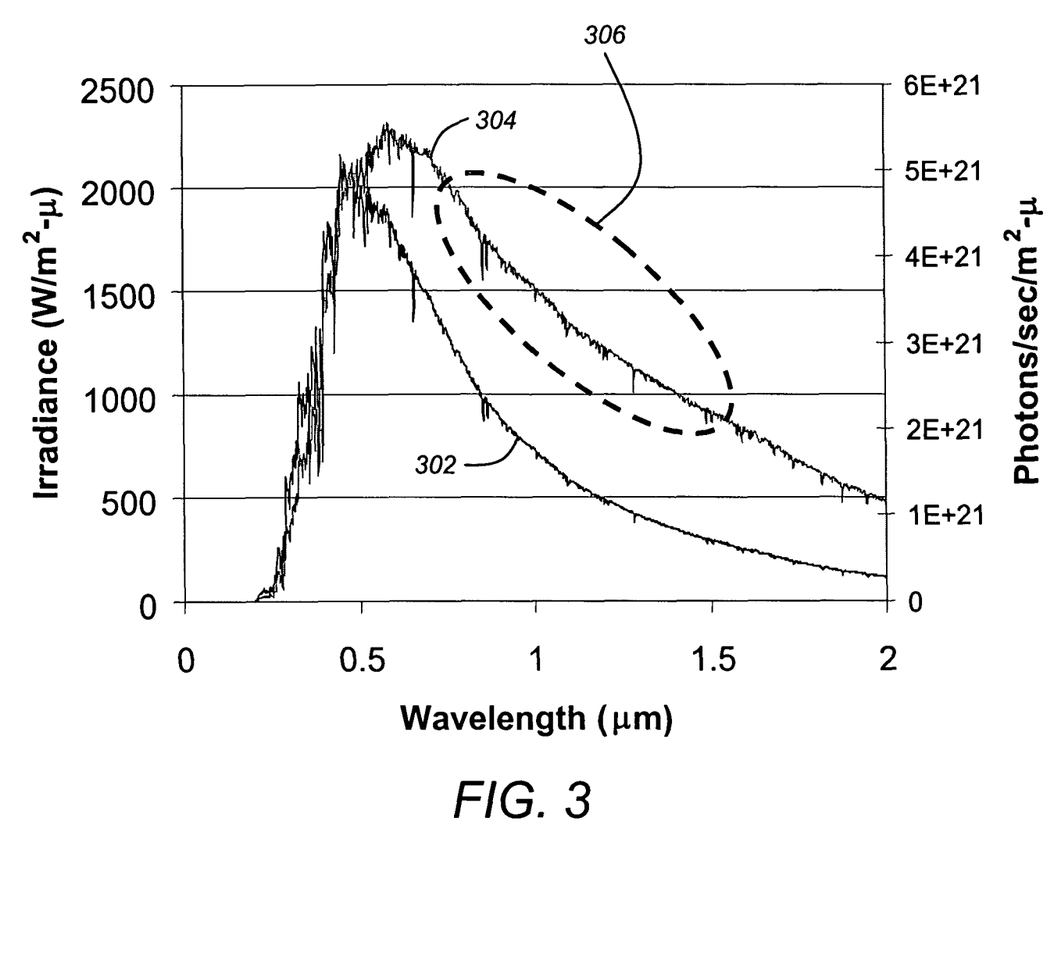
FIG. 3 is a plot comparing spectral characteristics of the solar radiation with that of the photon count.

FIG. 3 is a plot comparing spectral characteristics of the solar radiation with that of the photon count. Plot 302 shows the same information as plot 102 of FIG. 1, while plot 304 shows the photon count at the same respective wavelengths. As is shown in area 306 of plot 304, the photon count drops off slower as the wavelength goes up. This is due to the reduced energy per photon in these wavelength ranges.

Figure 4:
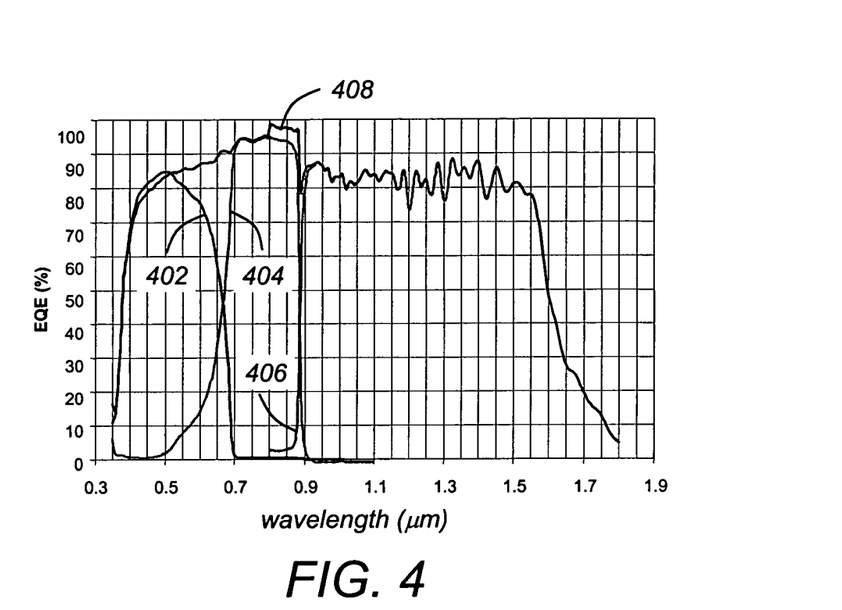
FIG. 4 is a plot of the quantum efficiency as for the Ge, GaAs and GaInP solar cell junctions.

A photon reaching a solar cell junction will produce an electron according to its quantum efficiency. FIG. 4 is a plot of the equivalent quantum efficiency as for the Ge solar cell junction 207 (plot 406), the GaAs solar cell junction 208 (plot 404) and the GaInP solar cell junction 210 (plot 402), and the total quantum efficiency for a three layer solar cell 200 using the foregoing layers (plot 408).

Figure 5:
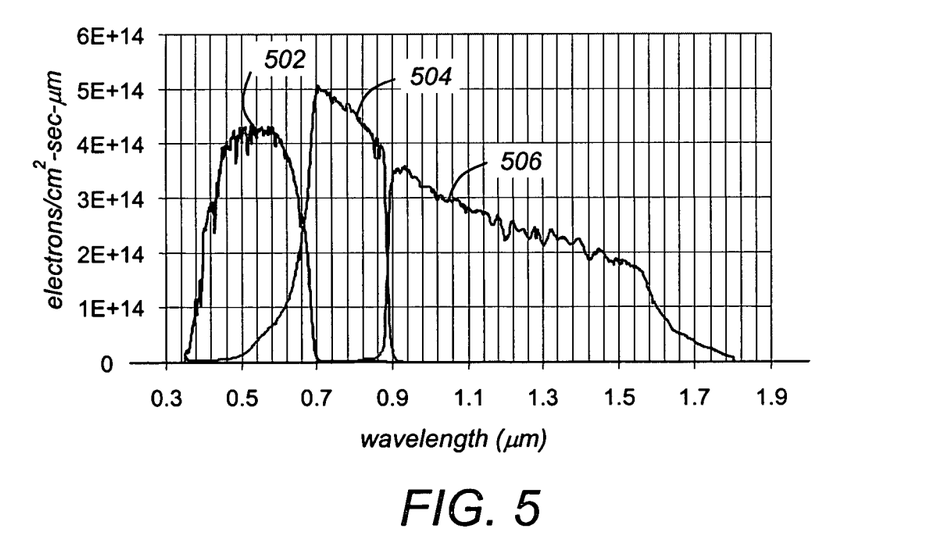
FIG. 5 is a diagram illustrates the theoretical current for the first, second, and third layer.

Combining the foregoing information regarding the photon distribution of solar energy (FIG. 2) and the quantum efficiency of each layer shown in FIG. 4 results in the theoretical current production (in electrons/cm$^2$-sec-$\mu$m) for each of the three layers/subcells. FIG. 5 is a diagram that illustrates the theoretical current for the first, second, and third layer in plots 506, 504, and 502, respectively. Integrating under the curves defined by plots 502, 504, and 506 produces a theoretical current capacity for each solar cell junction.

Table I illustrates the theoretical current (mA/cm$^2$) for solar cell junctions in each of the layers described above:

TABLE I

| | Solar Cell Junction | | |
| --- | --- | --- | --- |
| | GaInP | GaAs | Ge |
| Wavelength Band | (0.35-0.69 $\mu$m) | (0.6-0.89 $\mu$m) | (0.88-1.76 $\mu$m) |
| Theoretical Current | 17.0 | 17.6 | 28.5 |

Inspection of Table I reveals that the theoretical current capacity from the Ge solar cell junction 207 is substantially higher than that of the GaAs solar cell junction 208 and the GaInP solar cell junction 210. However, since the junctions 208-212 are electrically connected in series, the current produced will be limited by the lowest of the three. Hence, the theoretical current capacity of the GaInP solar cell junction 210 limits the total theoretical current capacity for the other solar cell junctions as well. As a consequence, the Ge solar cell junction's 207 excess current capacity is wasted as heat.

As described above, solar cells produce energy with reduced efficiency at elevated temperatures. Hence, the efficiency of the triple junction solar cell 200 can be increased if photons in the Ge wavelength band can be reflected to reduce heating (thus avoiding the resulting loss in solar efficiency $\eta$) while providing sufficient current (in an amount so that the theoretical current from the Ge junction 207 is about equal to that of the remaining solar cell junctions). At the same time, it is important not to reduce the current output from the remaining series-coupled junctions 208, 210. As discussed above, the shorter wavelength photons carry more energy than the longer wavelength photos, so reflecting the shorter wavelength photons reflects more energy. To decrease the temperature of the solar cell 200 to increase solar cell efficiency while not negatively impacting the current output solar cell, the applicants have devised a notch filter, having a bandwidth and center frequency such that the theoretical current capacity from the Ge solar cell junction 207 is reduced to approximately that of the remaining solar cell junctions 208, 210, while not appreciably impacting the theoretical current capacity of those junctions.

Figure 6:
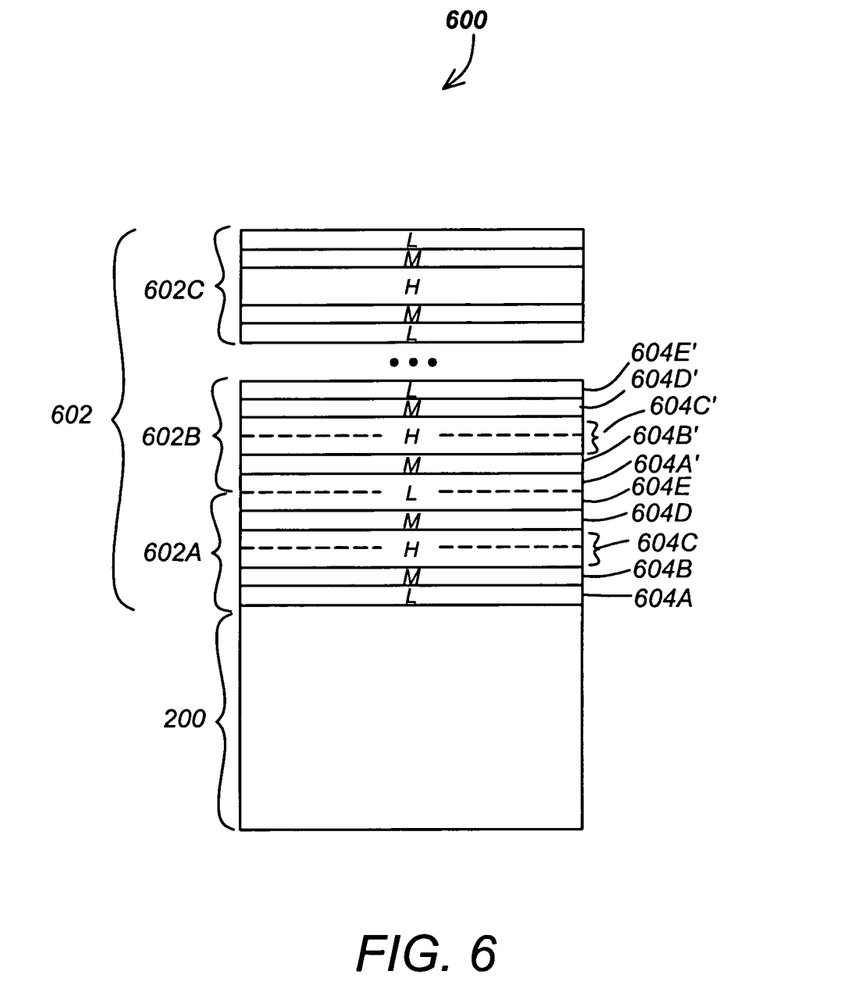
FIG. 6 is a diagram illustrating one embodiment of a solar device having a notch filter.

FIG. 6 is a diagram illustrating one embodiment of a solar device 600 having a notch filter 602. This notch filter 602 does not appreciably reduce the current producing capacity of the GaAs solar junction or the GaInP solar junction 208, 210 (there is <1% loss), and provides an appreciable reduction in solar $\alpha$ (e.g. the difference between the solar $\alpha$ with and without the filter $\Delta\alpha$ is 0.1 or greater).

In the embodiment shown in FIG. 6, this is accomplished by use of a periodic multi-layer construction (LMHHML)$^x$ of materials of different indicies of reflection wherein materials H and L having respective properties of high and low indices of refraction, material M having properties between those of materials H and L. The shorthand notation (ABA)$^x$ is shorthand for a periodic series of a thickness of the material A, layered over a thickness of the material B, layered over a thickness of the material A, e.g. (ABA), repeated x times. For example, the periodic series (ABAABAABAABAABA) can be written in shorthand notation as (ABA)$^5$. Repeating periods of LMHHML are used in series to sharpen the filter's notch through redundant filtering, but the invention can be practiced with as few as period of LMHHML, albeit with reduced efficiency.

In one embodiment, the L material is ¼ wavelength (quarter wave optical thickness at the design wavelength) silicon dioxide (SiO$_2$), the H material is ¼ wavelength hafnium dioxide (HfO$_2$) material, and the M material is ¼ wavelength of a mix of about 60% SiO$_2$ and 40% HfO$_2$. Where the layers of the notch filter 601 comprise adjacent layers of the same material (e.g. HH or LL), the a single layer of double-thickness material (e.g. ½ wavelength instead of ¼ wavelength) can be used.

FIG. 6 shows an embodiment where a single layer of double thickness material is used for the HH and LL layers. As illustrated, the notch filter 602 comprises a first period 602A of LMHHML material comprising a first layer 604A of ¼ wavelength L material disposed on the multijunction solar cell 200, a second layer 604B of ¼ wavelength M material disposed on the first layer 604A, a third layer 604C of ½ wavelength H material disposed on the second layer 604B (a dashed line is used to indicate that the ½ wavelength H material layer 604C may be two ¼ wavelength layers), a fourth layer 604D of ¼ wavelength M material disposed on the third layer 604C, and a fifth layer 604E of ¼ wavelength L material disposed on the fourth layer 604D. A second period of LMHHML material 602B (with elements indicated as 604A'-604E') is disposed on the first period of LMHHML material 602A. This process is repeated as necessary until the desired bandpass characteristics are realized. The dashed line between the last L material layer 604E of the first period 602A and the first L material layer 604A' of the second period 602B is again used to indicate that although ½ wavelength L layer material is used, L material layer this can be implemented by two ¼ wavelength layers.

The solar device 600 shown in FIG. 6 can be made by suitable deposition on the appropriate structure. Such deposition techniques can include, for example, growing via molecular beam or other epitaxial growth methods, chemical vapor deposition, drive and diffusion techniques, sputtering, and other standard semiconductor growth techniques. In one embodiment, the solar device 600 is produced by depositing a multijunction solar cell structure having at least first 202, second 204 and third 206 subcells on a substrate, and depositing the repeating pattern of layers of materials formed of materials H, M and L on the multifunction solar cell structure

200. U.S. Pat. No. 6,107,564, issued to Aguilera et al., which is hereby incorporated by reference herein, discloses further information regarding how the notch filter described above may be fabricated.

Figure 7:
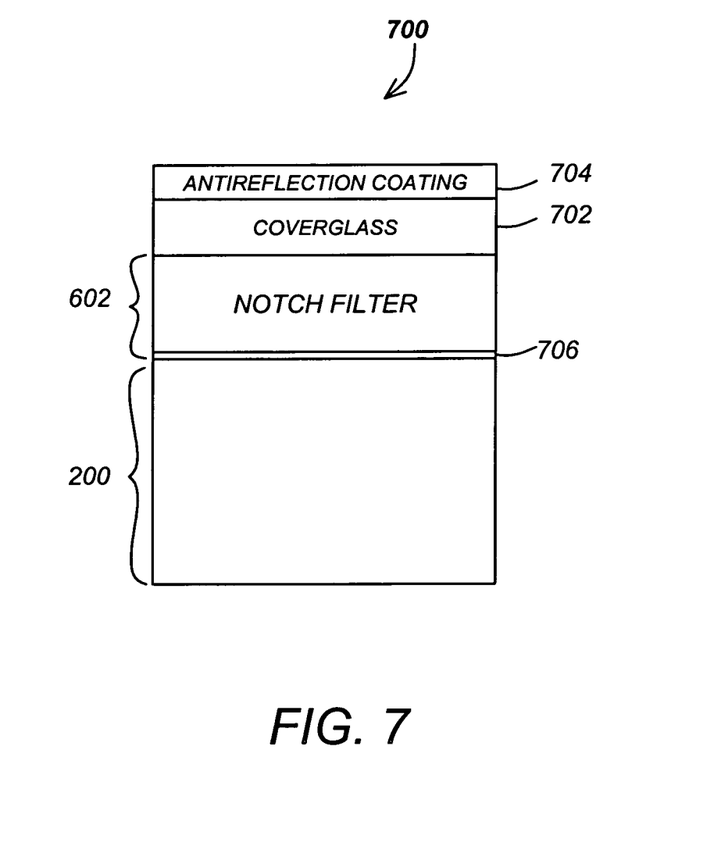
FIG. 7 is a diagram illustrating another embodiment of a solar device which further comprises a coverglass and an anti-reflection coating on the outside surface of the coverglass and in which the notch filter is formed on the coverglass and affixed to the solar cell via a coverglass adhesive.

FIG. 7 is a diagram illustrating another embodiment of a solar device 700 which further comprises a coverglass 702 and an anti-reflection coating 704 on the outside surface of the coverglass 702 and in which the notch filter 602 is formed on the coverglass 702 and affixed to the solar cell 200 via a coverglass adhesive 706. In this embodiment, the coverglass 702 itself can become the uppermost L material layer of the notch filter 602, as can an anti-reflection coating 704. If desired, a cerium-doped microsheet can be used between (or in front of) the notch filter 602 and the solar cell 200 to block energy in the ultraviolet spectrum.

Table II below provides one embodiment of the anti-reflection coating 704 where alternating layers of $HfO_2$ and $SiO_2$ are used. Layer #1 is disposed adjacent the coverglass.

TABLE II

| Layer # | Layer Formula | Layer Thickness (nm) |
|---|---|---|
| 1 | $HfO_2$ | 7.4-7.8 |
| 2 | $SiO_2$ | 50.6-53.6 |
| 3 | $HfO_2$ | 26.5-28.1 |
| 4 | $SiO_2$ | 23.4-24.8 |
| 5 | $HfO_2$ | 78.7-83.5 |
| 6 | $SiO_2$ | 10.8-11.4 |
| 7 | $HfO_2$ | 36.1-38.3 |
| 8 | $SiO_2$ | 90.3-95.9 |

Alternating layers of $SiO_2$, 60% $SiO_2$ and 40% $HfO_2$ (approximate volumetric blend ratios), and $HfO_2$ can be used to produce a notch filter 602, as shown in Table III. In this embodiments, the anti-reflection coating 704 and notch filter 602 coatings are applied to sides of the coverglass 702, and the notch filter side can affixed to the solar cell 200 with an adhesive. In the configuration, the adhesive 706 and the coverglass 702 provide the L material for the first and last layers.

TABLE III

| Layer # | Layer Formula | Layer Thickness (nm) | Layer Type |
|---|---|---|---|
| 2 | 60% $SiO_2$ 40% $HfO_2$ | 75.9-80.5 | M |
| 3, 4 | $HfO_2$ | 121.2-128.6 | HH |
| 5 | 60% $SiO_2$ 40% $HfO_2$ | 89.0-94.4 | M |
| 6, 7 | $SiO_2$ | 39.3-41.7 | LL |
| 8 | 60% $SiO_2$ 40% $HfO_2$ | 85.9-91.3 | M |
| 9, 10 | $HfO_2$ | 110.7-117.5 | HH |
| 11 | 60% $SiO_2$ 40% $HfO_2$ | 62.1-58.5 | M |
| 12, 13 | $SiO2$ | 138.8-147.4 | LL |
| 14 | 60% $SiO_2$ 40% $HfO_2$ | 58.5-62.1 | M |
| 15, 16 | $HfO_2$ | 97.6-103.6 | HH |
| 17 | 60% $SiO_2$ 40% $HfO_2$ | 58.5-62.1 | M |
| 18, 19 | $SiO_2$ | 138.8-147.4 | LL |
| 20 | 60% $SiO_2$ 40% $HfO_2$ | 58.5-62.1 | M |
| 21, 22 | $HfO_2$ | 97.6-103.6 | HH |
| 23 | 60% $SiO_2$ 40% $HfO_2$ | 58.5-62.1 | M |
| 24, 25 | $SiO2$ | 138.8-147.4 | LL |
| 26 | 60% $SiO_2$ 40% $HfO_2$ | 62.1-58.5 | M |
| 27, 28 | $HfO_2$ | 110.7-117.5 | HH |
| 29 | 60% $SiO_2$ 40% $HfO_2$ | 85.9-91.3 | M |
| 30, 31 | $SiO2$ | 39.3-41.7 | LL |
| 32 | 60% $SiO_2$ 40% $HfO_2$ | 89.0-94.4 | M |
| 33, 34 | $HfO_2$ | 121.2-128.6 | HH |
| 35 | 60% $SiO_2$ 40% $HfO_2$ | 75.9-80.5 | M |

Thin-film designs rely on index of refraction differences or the ratio of the index of refraction between two adjacent materials, and the resulting optical thickness (physical thickness*index of refraction) to define their characteristics when deposited. Accordingly, the number, composition, and thickness of the layers described above are selected to achieve the appropriate bandpass characteristics of the notch filter. In the embodiment shown in Table III, the layer materials and thicknesses are symmetric around layers 18 and 19. This redundancy provides a more robust method for accommodating layer-to-layer optical thickness variations that can arise in the manufacturing process.

Different layer formula compositions and layer thicknesses can also be used. For example, as the thickness of the layers is increased, the spectral characteristics of the notch filter also change, generally moving up in wavelength. Further, the index of refraction of the "M" material may be selected at different values, according to the relationship $i_M = \sqrt{i_H i_L}$. Techniques for selecting the appropriate number, composition, and thicknesses of the layers are set forth more fully in U.S. Pat. No. 6,107,564, U.S. Pat. No. 3,423,147, U.S. Pat. No. 3,914,023, U.S. Pat. No. 4,229,066, U.S. Pat. No. 5,449,413, and the paper "Multilayer Films with Wide Transmission Bands," J. Opt. Soc. Am 53, 1266, by Thelan, all of which are hereby incorporated by reference herein.

The periodic multi-layer construction $(LMHHML)^x$ may also include other intervening layers, so long as such additional layers do not significantly impact the spectral characteristics of the notch filter 602.

The solar device 700 shown in FIG. 7 can be made by suitable deposition on the appropriate structure. Such deposition techniques can include, for example, growing via molecular beam or other epitaxial growth methods, chemical vapor deposition, drive and diffusion techniques, sputtering, and other standard semiconductor growth techniques. In one embodiment, the solar device 700 is produced by depositing a multijunction solar cell structure having at least first 202, second 204 and third 206 subcells on a substrate, and depositing the repeating pattern of layers of materials formed of materials H, M and L, depositing a notch filter, comprising a repeating pattern of layers of materials formed of materials H, M and L a first side of a coverglass, and adhering the coverglass to the multijunction solar cell structure, the repeating pattern comprising $(LMHHML)^x$, materials H and L having respective properties of high and low indices of refraction, material M having properties between those of materials H and L.

Figure 8:
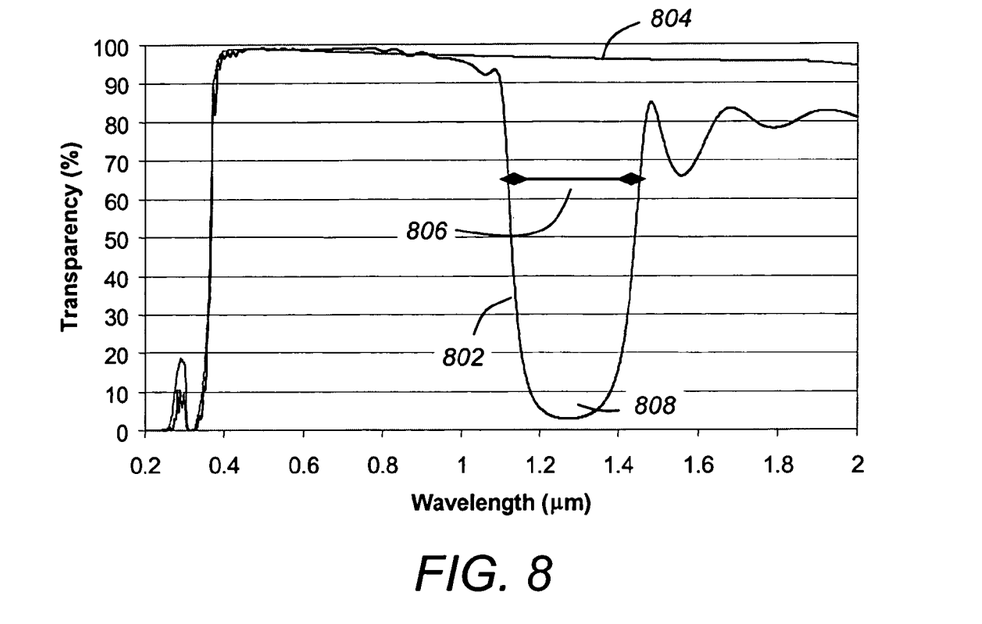
FIG. 8 is a plot of the spectral response of a notch filter.

FIG. 8 is a plot of the spectral response of the notch filter 602 described above. Plot 802 shows the transparency of the notch filter 602 as a function of wavelength, while plot 804 shows the transparency of a simple magnesium flouride ($MgF_2$) filter. As shown, the notch filter 602 provides a reflectance band 806 in the wavelengths of interest.

Figure 9:
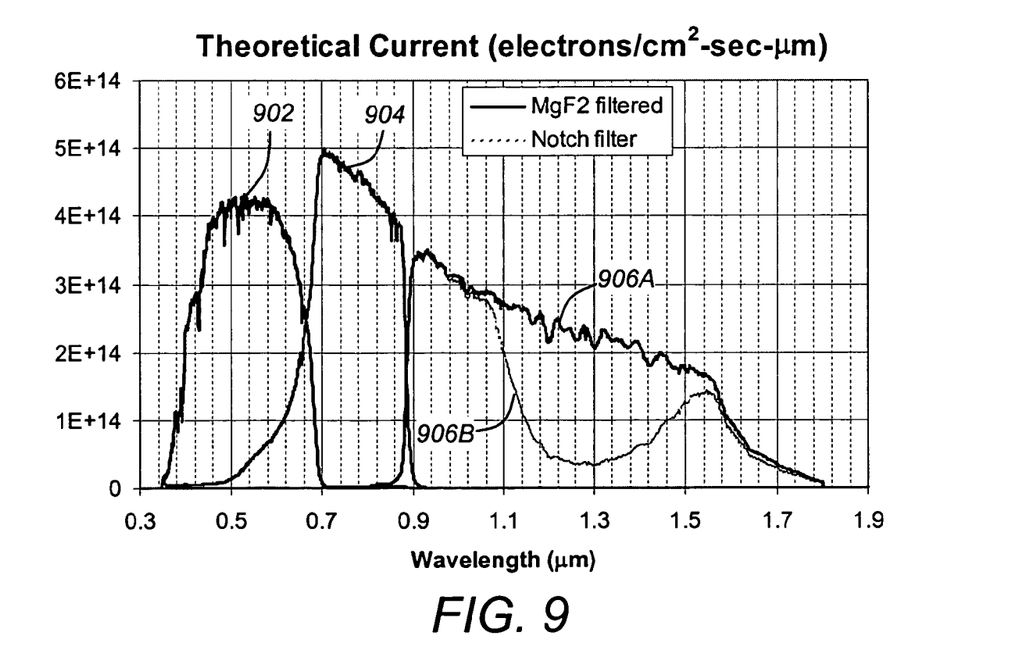
FIG. 9 is a diagram showing the theoretical current from the triple junction solar cell.

FIG. 9 is a diagram showing the theoretical current from the triple junction solar cell 200. Plot 902 shows the theoretical current from the GaInP layer 206, plot 904 shows the theoretical current from the GaAs layer 204, while plots 906A and 906B show the theoretical current from the Ge layer. Note that the notch filter substantially reduces the theoretical current in a band of wavelengths from 0.96 to 1.59 μm. Integrating the area under these curves results in the result shown in Table IV below:

TABLE IV

| Theoretical Currents | Solar Cell Junction | | |
|---|---|---|---|
| (mA/cm$^2$) | GaInP | GaAs | Ge |
| | (0.35-0.69 μm) | (0.6-0.89 μm) | (0.88-1.76 μm) |
| MgF$_2$ Filter | 17.0 | 17.6 | 28.5 |
| Notch Filter 602 | 17.0 | 17.7 | 17.9 |

It is known that the spectral performance of the filters described above vary with incidence angle θ, in terms of the center wavelength and the depth of the notch provided by the notch filter 602. Typically, the notch 808 shifts to shorter wavelengths as the incidence angle θ diverges from 90 degrees (normal to the surface). Since the notch filter 602 preferably does not compromise the performance of the remaining solar cell junctions 208-210, the notch filter 602 may be designed to avoid the shift of the notch within the active band of the GaAs solar cell junction 208 by selecting the location of the notch filter's notch to longer wavelengths.

Figure 10:
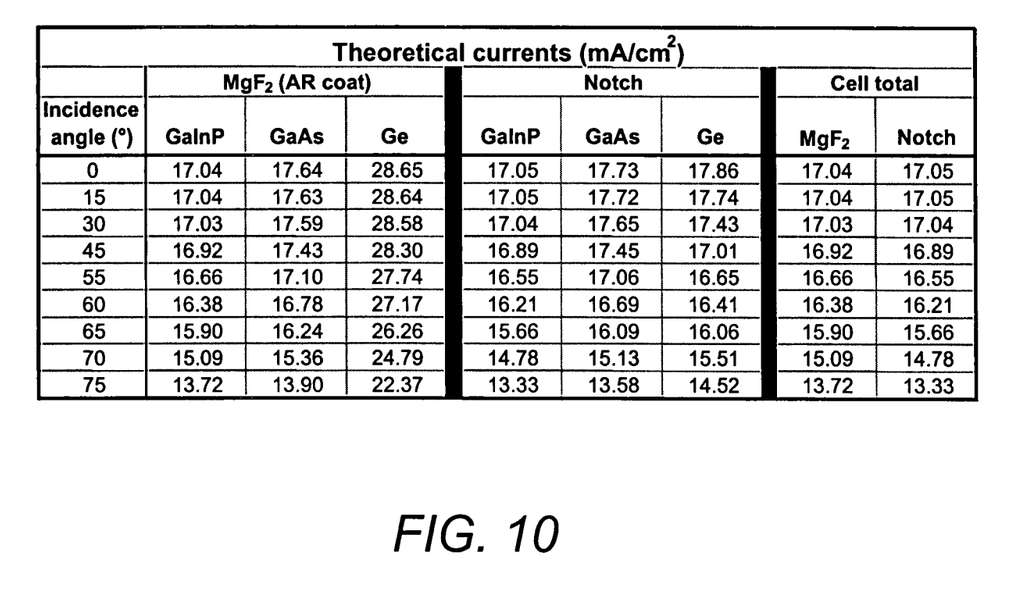
FIG. 10 presents a table showing the theoretical current capacity per projected solar area for each of the solar cell junctions for a variety of incidence angles.

FIG. 10 presents a table showing the theoretical current capacity per projected solar area for each of the solar cell junctions for a variety of incidence angles. Very steep incidence angles (70 degrees and above) are insignificant contributors to the electrical power system. The cell total columns refer to the cell total obtained from the current limiting solar cell junction (in all cases, the GaInP junction) 210.

Figure 11:
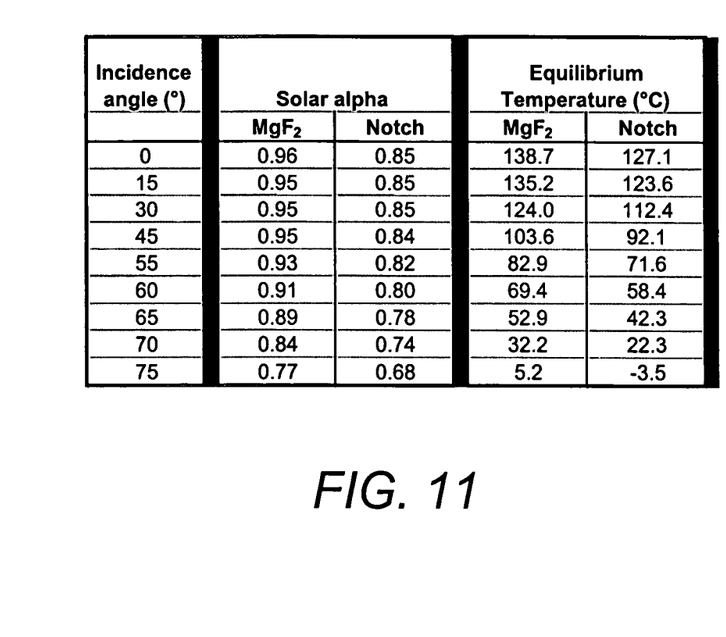
FIG. 11 presents a table showing the solar absorptance ($\alpha$) and solar cell equilibrium temperature.

FIG. 11 presents a table showing the solar absorptance (α) and solar cell equilibrium temperature. Note that in incidence angles of interest, solar cell temperature are reduced by about 10 degrees Celsius, providing an increase in cell conversion efficiency of in the order of one percent. While this improvement may seem small, this translates into a 3-4% increase in power.

A notch filter 602 with the spectral characteristics shown in FIG. 8 provides an optimal amount of solar energy from the Ge junction 207 wavelength band without impacting the GaInP or GaAs junctions 210, 208 for all ranges of incidence angles Θ. However, other less optimal designs may be used. For example, the transparency of the notch filter 602 in the GaInP and/or GaAs junction 210, 208 wavelengths can be reduced, thereby decreasing the electrical current output and the overall solar cell 602 efficiency. The depth and/or the width of the reflecting notch 808 could also be reduced or increased by altering the number, composition, and thicknesses of the notch filter 602 layers. If the bandwidth of the notch 806 is reduced, then a less than optimal quantity of sunlight is reflected, leading to an increase in the solar cell temperature and reduced solar cell efficiency. If the bandwidth of the notch 806 is increased, then too much sunlight will be reflected, causing the Ge junction 207 to become the current limiter of the triple junction solar cell, significantly reducing the solar cell efficiency. Similarly, if the notch 806 is shifted to a longer wavelength, less solar energy is reflected, leading to an increased solar cell temperature. If the notch 806 is shifted to a shorter wavelength, the notch filter 602 will reflect sunlight from the GaAs junction 208 wavelengths, and make the GaAs junction 208 even more of a current limiter, particularly for off-normal incidence angles Θ.

CONCLUSION

This concludes the description of the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A solar device, comprising:
a multijunction solar cell structure having at least a first subcell and a second subcell, wherein the first subcell comprises a first junction producing current from incident photons in a first wavelength band, the second subcell comprises a second junction producing current from incident photons in a second wavelength band, and the first and second junctions are associated with a first and second theoretical current capacity, respectively, such that the first theoretical current capacity is greater than the second theoretical current capacity; and
a notch filter deposited onto the multijunction solar cell structure, wherein the notch filter has a bandwidth and center frequency such that some photons in the first wavelength band are reflected to reduce heating, although the incident photons in the first wavelength band provide sufficient current so that the first theoretical current capacity of the first junction is about equal to the second theoretical current capacity of the second junction, while not reducing the current produced from the second junction.

2. The solar device of claim 1, wherein:
the multijunction solar cell structure comprises a triple junction solar cell further comprising a third subcell.

3. The solar device of claim 2, wherein the first, second, and third subcells are germanium (Ge), gallium arsenide (GaAs) and gallium-indium-phosphide (GaInP) subcells.

4. The solar device of claim 2, wherein:
the third subcell comprises a third junction producing current from incident photons in a third wavelength band;
the first, second, and third junctions are associated with the first, the second, and a third theoretical current capacity, respectively, the first theoretical current capacity being greater than the second theoretical current capacity and greater than the third theoretical current capacity;
the notch filter notch reflects the photons in the first wavelength band to reduce the current produced by the first junction to approximately the current produced by the second and third junctions.

5. The solar device of claim 1, wherein the photons are incident to the multijunction solar cell structure at an incident angle θ unequal to 90 degrees.

6. The solar device of claim 1, further comprising a cerium-doped microsheet disposed between the notch filter and the multijunction solar cell structure.

7. The solar device of claim 1, wherein the notch filter comprises a repeating pattern of layers of materials formed of materials H, M and L, the repeating pattern comprising (LM-HHML)$^x$, materials H and L having respective properties of high and low indices of refraction, material M having properties between those of materials H and L, each material H, M, and L is deposited in one-quarter wavelength optical thicknesses, and the notch filter substantially reflects a wavelength band of frequencies between 0.96 microns and 1.59 microns.

8. The solar device of claim 7, wherein x=6.

9. A method for making a solar device, comprising:
depositing a multijunction solar cell structure having at least first subcell and a second subcell on a substrate, wherein the first subcell comprises a first junction producing current from incident photons in a first wavelength band, the second subcell comprises a second junction producing current from incident photons in a second wavelength band, and the first and second junctions are associated with a first and second theoretical current capacity, respectively, such that the first theoretical current capacity is greater than the second theoretical current capacity; and
depositing a notch filter onto the multijunction solar cell structure, wherein the notch filter has a bandwidth and center frequency such that some photons in the first wavelength band are reflected to reduce heating, although the incident photons in the first wavelength band provide sufficient current so that the first theoretical current capacity of the first junction is about equal to the second theoretical current capacity of the second junction, while not reducing the current produced from the second junction.

10. The method of claim 9, wherein:
the multijunction solar cell structure comprises a triple junction solar cell further comprising a third subcell.

11. The method of claim 10, wherein the first, second, and third subcells are germanium (Ge), gallium arsenide (GaAs) and gallium-indium-phosphide (GaInP) subcells.

12. The method of claim 9, wherein the notch filter comprises a repeating pattern of layers of materials formed of materials H, M and L, the repeating pattern comprising (LM-HHML)$^x$, materials H and L having respective properties of high and low indices of refraction, material M having properties between those of materials H and L, each material H, M, and L is deposited in one-quarter wavelength optical thicknesses, and the notch filter substantially reflects a wavelength band of frequencies between 0.96 microns and 1.59 microns.

13. A method of making a solar device, comprising:
depositing a multijunction solar cell structure having at least first and second subcells on a substrate, wherein the first subcell comprises a first junction producing current from incident photons in a first wavelength band, the second subcell comprises a second junction producing current from incident photons in a second wavelength band, and the first and second junctions are associated with a first and second theoretical current capacity, respectively, such that the first theoretical current capacity is greater than the second theoretical current capacity; and
depositing a notch filter onto the multijunction solar cell, wherein the notch filter has a bandwidth and center frequency such that some photons in the first wavelength band are reflected to reduce heating, although the incident photons in the first wavelength band provide sufficient current so that the first theoretical current capacity of the first junction is about equal to the second theoretical current capacity of the second junction, while not reducing the current produced from the second junction.

14. The method of claim 13, wherein:
the multijunction solar cell structure comprises a triple junction solar cell further comprising a third subcell.

15. The method of claim 14, wherein the first, second, and third subcells are germanium (Ge), gallium arsenide (GaAs) and gallium-indium-phosphide (GaInP) subcells.

16. The method of claim 13, wherein the notch filter comprises a repeating pattern of layers of materials formed of materials H, M and L, the repeating pattern comprising (LM-HHML)$^x$, materials H and L having respective properties of high and low indices of refraction, material M having properties between those of materials H and L, each material H, M, and L is deposited in one-quarter wavelength optical thicknesses, and the notch filter substantially reflects a wavelength band of frequencies between 0.96 microns and 1.59 microns.

17. A solar device, comprising:
a multijunction solar cell structure, having at least a first subcell and a second subcell, wherein the first and second subcells comprise series-coupled junctions that are sensitive to a respective first wavelength band and a second wavelength band of incident photons for producing current, and the first and second junctions are associated with a first and second theoretical current capacity, respectively, such that the first theoretical current capacity is greater than the second theoretical current capacity; and
a notch filter deposited onto the multijunction solar cell structure for reflecting the first wavelength band of incident photons to reduce the current of the first junction to about equal the current of the second junction, while not reducing the current produced from the second junction.

18. The solar device of claim 17, wherein the notch filter comprises a repeating pattern of layers of materials formed of materials H, M and L disposed over the multijunction solar cell structure, the repeating pattern comprising (LMH-HML)$^x$, materials H and L having respective properties of high and low indices of refraction, material M having properties between those of materials H and L.

19. A GaAs/xxx/Ge triple junction solar cell having a notch filter to reduce heating within the cell and to achieve near current matching between the junctions, wherein "xxx" is a photoactive junction compatible with GaAs and Ge and functional within the triple junction to capture energy in the band passed by GaAs but outside the conversion band for Ge, and the notch filter partially reflects energy within the conversion band for Ge to reduce the current produced by the Ge junction to about equal the current produced by the GaAs and xxx junctions, while not reducing the current produced from the GaAs and xxx junctions.

\* \* \* \* \*